(12) United States Patent
Guo et al.

(10) Patent No.:  US 12,688,337 B2
(45) Date of Patent:      Jul. 21, 2026

(54) KNOWLEDGE GRAPH-DRIVEN GROUNDWATER-ORIENTED METHOD AND DEVICE FOR BUILDING RISK WARNING

(71) Applicant: PEKING UNIVERSITY, Beijing (CN)

(72) Inventors: Yanjun Guo, Beijing (CN); Min Xia, Beijing (CN); Guangfeng Chen, Beijing (CN); Mao Pan, Beijing (CN); Zhenshan Li, Beijing (CN); Bin Chen, Beijing (CN); Chuxiong Liu, Beijing (CN); Ronghua Wang, Beijing (CN); Lu Wang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 19/018,029

(22) Filed: Jan. 13, 2025

(65) Prior Publication Data

US 2025/0335645 A1      Oct. 30, 2025

(30) Foreign Application Priority Data

Apr. 25, 2024    (CN) .......................... 202410501575.5

(51) Int. Cl.
*G06F 30/13*       (2020.01)
*G06F 30/28*       (2020.01)
*G06N 5/022*       (2023.01)

(52) U.S. Cl.
CPC .............. *G06F 30/13* (2020.01); *G06F 30/28* (2020.01); *G06N 5/022* (2013.01)

(58) Field of Classification Search
CPC ......... G06F 30/13; G06F 30/28; G06N 5/022; G06N 5/02; G06N 5/025
See application file for complete search history.

(56) References Cited

U.S. PATENT DOCUMENTS

| | | | | | |
|---|---|---|---|---|---|
| 5,850,560 | A | * | 12/1998 | Kang | ........................ G06F 1/32 |
| | | | | | 713/324 |
| 12,055,624 | B2 | * | 8/2024 | Ma | ........................... G06T 7/13 |

(Continued)

FOREIGN PATENT DOCUMENTS

| | | |
|---|---|---|
| CN | 114358507 A | 4/2022 |
| CN | 116049929 A | 5/2023 |

(Continued)

OTHER PUBLICATIONS

Antwi-Agyakwa, K., et al. "Know to Predict, Forecast to Warn: A Review of Flood Risk Prediction Tools" Water, vol. 15, issue 3, 427 (2023) and <https://www.mdpi.com/2073-4441/15/3/427> (Year: 2023).*

(Continued)

*Primary Examiner* — Jay Hann
(74) *Attorney, Agent, or Firm* — METIS IP LLC

(57)                ABSTRACT

A knowledge graph-driven groundwater-oriented method for building risk warning includes: extracting a relationship quadruple between groundwater level change and building structure change based on collected groundwater level data and building data; creating a cross-domain knowledge graph based on the relationship quadruple, and associating two different fields; updating the cross-domain knowledge graph in real time to realize the building risk warning caused by groundwater level changes. The risk warning is based on the causal relationship reflected in the factual data, making the risk warning more accurate, which can effectively solve the problem of the lack of risk warning system for buildings due to groundwater level changes in the related art.

9 Claims, 3 Drawing Sheets

(56) References Cited

U.S. PATENT DOCUMENTS

| 2022/0269936 A1* | 8/2022 | Zhu | G06N 3/04 |
| 2024/0104480 A1* | 3/2024 | Chevuru | G06Q 10/06393 |

FOREIGN PATENT DOCUMENTS

| CN | 116205492 A | 6/2023 |
| CN | 116611581 A | 8/2023 |
| WO | 2023065545 A1 | 4/2023 |

OTHER PUBLICATIONS

Koch, J., et al. "High Resolution Water Table Modeling of the Shallow Groundwater Using a Knowledge-Guided Gradient Boosting Decision Tree Model" Frontiers in Water, vol. 3, article 701726 (2021) (Year: 2021).*

Wang, L., et al. "Multimodal knowledge graph construction for risk identification in water diversion projects" J. Hydrology, vol. 635, 131155 (Apr. 9, 2024) available from <https://www.sciencedirect.com/science/article/pii/S002216942400550X> (Year: 2024).*

First Office Action issued in counterpart Chinese Patent Application No. 202410501575.5, dated May 30, 2024.

Notification to Grant Patent Right for Invention issued in counterpart Chinese Patent Application No. 202410501575.5, dated Jun. 13, 2024.

* cited by examiner

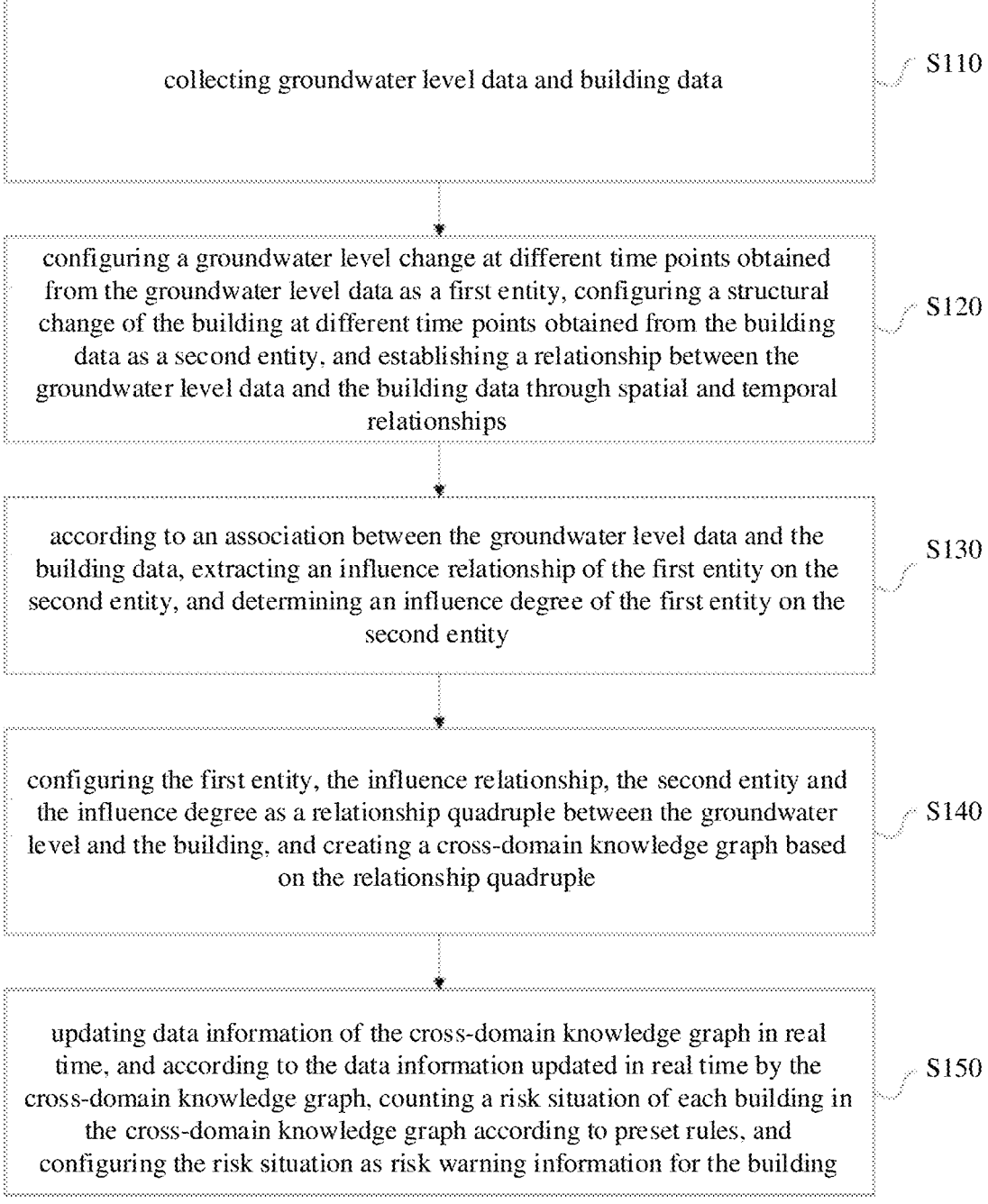

collecting groundwater level data and building data — S110 configuring a groundwater level change at different time points obtained from the groundwater level data as a first entity, configuring a structural change of the building at different time points obtained from the building data as a second entity, and establishing a relationship between the groundwater level data and the building data through spatial and temporal relationships — S120 according to an association between the groundwater level data and the building data, extracting an influence relationship of the first entity on the second entity, and determining an influence degree of the first entity on the second entity — S130 configuring the first entity, the influence relationship, the second entity and the influence degree as a relationship quadruple between the groundwater level and the building, and creating a cross-domain knowledge graph based on the relationship quadruple — S140 updating data information of the cross-domain knowledge graph in real time, and according to the data information updated in real time by the cross-domain knowledge graph, counting a risk situation of each building in the cross-domain knowledge graph according to preset rules, and configuring the risk situation as risk warning information for the building — S150

FIG. 1

KNOWLEDGE GRAPH-DRIVEN GROUNDWATER-ORIENTED METHOD AND DEVICE FOR BUILDING RISK WARNING

CROSS-REFERENCE TO RELATED APPLICATIONS

The present application claims priority to Chinese Patent Application No. 202410501575.5, and filed on Apr. 25, 2024, the entire contents of which are incorporated herein by reference.

TECHNICAL FIELD

The present application relates to the field of electronic technology, in particular to a knowledge graph-driven groundwater-oriented method and device for building risk warning.

BACKGROUND

The geological risks caused by the rise of groundwater levels have a huge impact on buildings and large-scale infrastructure projects, such as anti-floating and foundation stability.

At present, there are many technologies and methods for risk warning of buildings, such as structural health monitoring (SHM) system: using sensor networks to monitor the structural health of buildings. These sensors can monitor parameters such as vibration, displacement, strain, and detect any abnormal conditions such as cracks, deformation or material fatigue through real-time data analysis, thereby warning of potential structural problems; another example is geological survey and terrain analysis: before the site selection of the building, through geological survey and terrain analysis, the geological conditions and terrain characteristics of the surrounding environment are evaluated to predict possible natural disaster risks, such as earthquakes, mudslides, etc., and take corresponding building design and reinforcement measures; another example is risk model and simulation technology: using mathematical models and computer simulation technology to model and analyze the behavior of buildings under different conditions, so as to evaluate the impact of various risk factors on buildings, such as wind loads, earthquakes, floods, etc., and warn possible risks in advance.

However, the above-mentioned existing risk warning technology for buildings is generally based on the actual detection of influencing factors by the equipment and then obtained through analysis. It lacks factual basis and is not suitable for completing risk warning for buildings based on the impact of groundwater levels on buildings. That is, the current existing technology lacks a warning method for building risks caused by changes in groundwater levels.

SUMMARY

Based on the existing knowledge graph-driven groundwater-oriented current status for building risk warning, the present application provides a knowledge graph-driven groundwater-oriented method and device for building risk warning, to overcome at least one technical problem existing in the related art.

To achieve the above purpose, the present application provides a knowledge graph-driven groundwater-oriented method for building risk warning, including:

collecting groundwater level data and building data; the groundwater level data includes a location coordinate and time series data of groundwater level corresponding to the location coordinate; the building data includes a position coordinate of a building and structural information of the building at different time points;

configuring a groundwater level change at different time points obtained from the groundwater level data as a first entity, configuring a structural change of the building at different time points obtained from the building data as a second entity, and establishing a relationship between the groundwater level data and the building data through spatial and temporal relationships;

according to an association between the groundwater level data and the building data, extracting an influence relationship of the first entity on the second entity, and determining an influence degree of the first entity on the second entity;

configuring the first entity, the influence relationship, the second entity and the influence degree as a relationship quadruple between the groundwater level and the building, and creating a cross-domain knowledge graph based on the relationship quadruple; and updating data information of the cross-domain knowledge graph in real time, and according to the data information updated in real time by the cross-domain knowledge graph, counting a risk situation of each building in the cross-domain knowledge graph according to preset rules, and configuring the risk situation as risk warning information for the building.

In order to solve the above problem, the present application further provides a knowledge graph-driven groundwater-oriented device for building risk warning, including:

a data acquisition module, configured for collecting groundwater level data and building data; the groundwater level data includes location coordinate and time series data of the groundwater level corresponding to the location coordinate; the building data includes the position coordinate of the building and structural information of the building at different time points;

an entity relationship establishment module, configured for taking groundwater level changes at the different time points obtained from the groundwater level data as a first entity, taking structural changes of the building at the different time points obtained from the building data as a second entity, and establishing an association between the groundwater level data and the building data through spatial and temporal relationships;

a relationship extraction module, configured for extracting an influence relationship of the first entity on the second entity, and determining an influence degree of the first entity on the second entity according to the association between the groundwater level data and the building data;

a knowledge graph creation module, configured for taking the first entity, the influence relationship, the second entity and the influence degree as a relationship quadruple between the groundwater level and the building, and creating a cross-domain knowledge graph based on the relationship quadruple; and a warning module, configured for updating data information of the cross-domain knowledge graph in real time, and according to the data information updated in real time by the cross-domain knowledge graph, counting risk situation of each building in the cross-domain knowledge graph based on preset rules, and taking the risk situation as risk warning information for the building.

In order to solve the above problem, the present application further provides an electronic device, including:

at least one processor; and a memory connected to the at least one processor in communication;

the memory stores instructions executable by the at least one processor, and the instructions are executed by the at least one processor so that the at least one processor executes the steps in the knowledge graph-driven groundwater-oriented method for building risk warning.

In order to solve the above problem, the present application further provides a computer-readable storage medium, storing at least one instruction; when the at least one instruction is executed by a processor in an electronic device, the knowledge graph-driven groundwater-oriented method for building risk warning is implemented.

The knowledge graph-driven groundwater-oriented method and device for building risk warning provided by the present application collects groundwater level data and building data, extracts the relationship quadruple between groundwater level changes and building structural changes based on the collected data, creates a cross-domain knowledge graph based on the relationship quadruple, associates two different fields, effectively combines the two fields through the knowledge graph, and updates the cross-domain knowledge graph in real time to achieve building risk warning caused by groundwater level changes. The risk warning is based on the causal relationship reflected in the factual data, making the risk warning more accurate and effectively solving the problem of the lack of a risk warning system for buildings due to groundwater level changes in the related art. The present application can use a cross-domain comprehensive knowledge graph to provide more comprehensive urban planning decision-making support and better cope with the complex challenges in urban construction.

BRIEF DESCRIPTION OF THE DRAWINGS

In order to more clearly illustrate the technical solutions in the embodiments of the present application, the drawings needed to be used in the description of the embodiments will be briefly introduced below. Obviously, the drawings in the following description are only some embodiments of the present application. For those skilled in the art, other drawings can also be obtained based on these drawings without exerting creative efforts.

FIG. 1 is a flow chart of a knowledge graph-driven groundwater-oriented method for building risk warning according to an embodiment of the present application.

Figure 2:
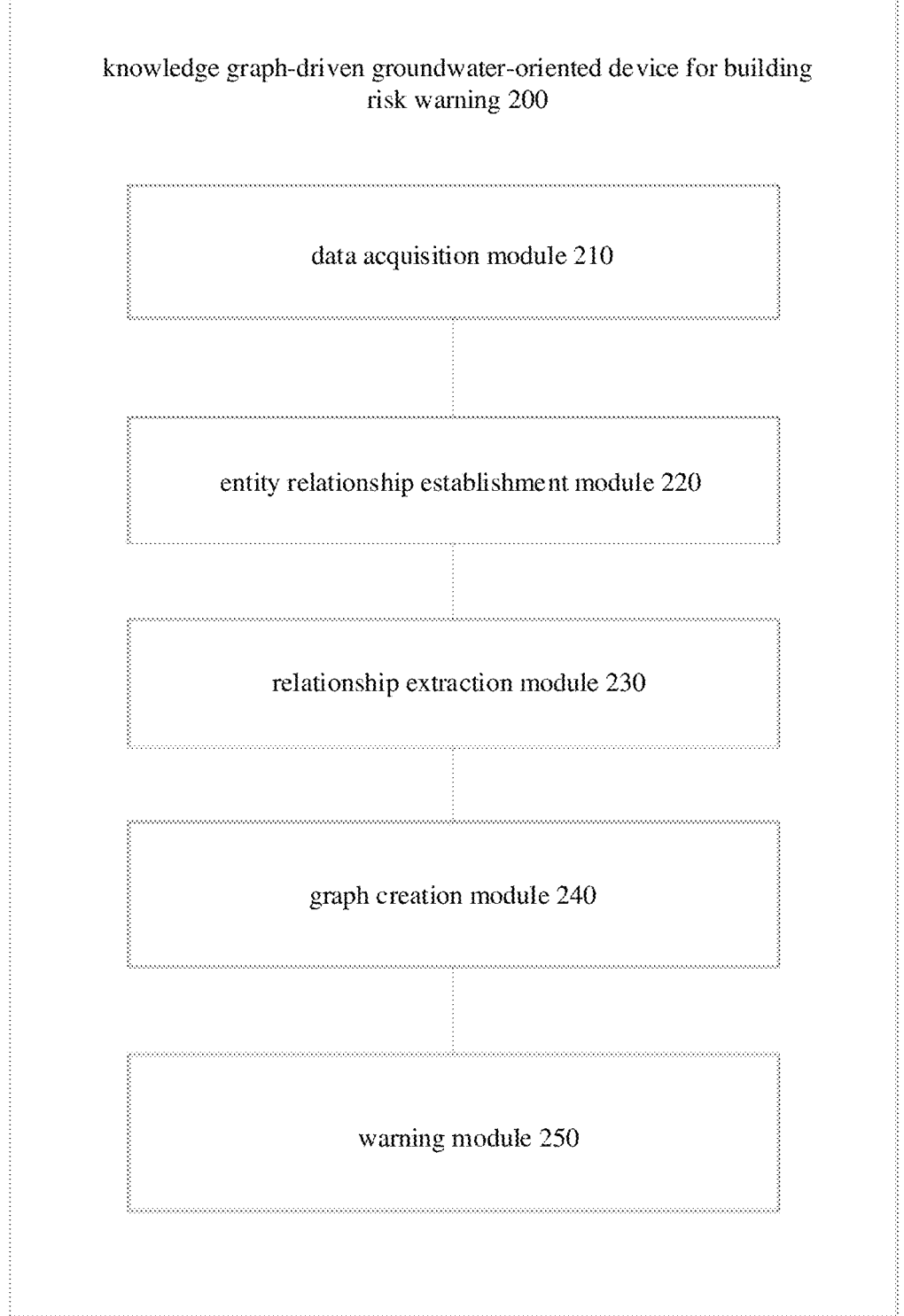
FIG. 2 is a module diagram of a knowledge graph-driven groundwater-oriented device for building risk warning according to an embodiment of the present application.

The realization of the purpose, functional features and advantages of the present application will be further explained in conjunction with embodiments and with reference to the accompanying drawings.

DETAILED DESCRIPTION OF THE EMBODIMENTS

It should be understood that the specific embodiments described herein are only used to explain the present application and are not used to limit the present application.

Based on the problems existing in the above-mentioned related art, the present application mainly provides a knowledge graph-driven groundwater-oriented method and device for building risk warning, the main purpose of which is to solve the problems that the risk warning technology of buildings in the related art is generally based on the influencing factors actually detected by the equipment and then obtained through analysis, which lacks factual basis, and is not suitable for completing risk warning of buildings based on the impact of groundwater level on buildings.

FIG. 1 is a flow chart of a knowledge graph-driven groundwater-oriented method for building risk warning provided in an embodiment of the present application. The method can be executed by a device, which can be implemented by software and/or hardware.

FIG. 1 provides an overall description of the knowledge graph-driven groundwater-oriented method for building risk warning. As shown in FIG. 1, in this embodiment, the knowledge graph-driven groundwater-oriented method for building risk warning includes steps S110~S150.

Step S110, collecting groundwater level data and building data; the groundwater level data includes location coordinate and time series data of groundwater level corresponding to the location coordinate; the building data includes position coordinate of a building and structural information of the building at different time points.

In an embodiment, the groundwater level data and building data can be obtained from the data base respectively, and the groundwater level data includes the location coordinate and the time series data of the groundwater level corresponding to the location coordinate; the time series refers to a sequence consisting of a plurality of preset time points, and the interval time of adjacent time points can be set according to actual needs; each two adjacent time intervals in the time series can be the same or different, that is, the groundwater level data records the data of the groundwater level height at different locations and different time points of each location. The building data includes the position coordinate of the building and the structural information of the building at different time points; the position coordinate of the building is used to indicate the position of the building, and the structural information is used to indicate the internal structure of the building, such as the structural condition of the foundation, the structural condition of the wall, etc. Of course, the building data is not limited to the above information, and can also include more specific information such as the year of construction. It should be noted that the location coordinate and the position coordinate of the building are the general geographical position coordinate.

The collection of groundwater level data and building data includes the following steps:

collecting original groundwater level data and original building data from the database respectively; and preprocessing the original groundwater level data and original building data to remove data with missing information, thereby obtaining groundwater level data and building data.

Useless data in the original data is removed by preprocessing, so that the obtained data has higher availability. In addition, in order to better use the groundwater level data and building data in the future, the preprocessed data can also be structured. For example, the preprocessed groundwater level data and the preprocessed building data are loaded into the preset groundwater level data table and the preset building data respectively, so as to obtain structured groundwater level data and building data; the preset groundwater level data table includes the location coordinate and the water level data of the location coordinate in different time series; the building data includes the position coordinate of the building and the structural information of the building in different time series. The data processed by structured processing can make the data more regular, which is convenient for the subsequent association and relationship extraction of the two types of data.

Step S120, the groundwater level changes at different time points obtained from the groundwater level data are taken as the first entity; the structural changes of the building at different time points obtained from the building data are taken as the second entity; and the association between the groundwater level data and the building data is established through spatial and temporal relationships.

In an embodiment, entities in groundwater level data and building data can be identified by naming field identification method. For example, from the data of "at time point A, the groundwater level of the coordinates of location M is 0.5 meters; and at time point B, the groundwater level of the coordinates of location M rises by 0.5 meters and becomes 1 meter", the first entity can be directly identified from the data by naming the identification field of groundwater level rise or groundwater level fall. It is also possible to identify the values corresponding to the water level heights at two time points by setting the water level height as a field, and then calculate the groundwater level change at the current time point by using a preset calculation model as the first entity. The method for obtaining the second entity can also adopt the field naming identification method. For example, in a certain building data, it is given that the foundation of building N is normal at time point A, but at time point B, foundation seepage occurs. If foundation seepage is set as an identification field in advance, the foundation seepage can be obtained from the above materials as the second entity. The entity extraction method used in the present application is the same as the named entity recognition method used in the triple extraction in the related art, which is a common method in this field, so no further details are given.

Establishing the association between groundwater level data and building data through spatial and temporal relationships means establishing the association between groundwater level data and building data based on the same spatial position and the same time point, so that the groundwater level data and building data are combined.

As an optional embodiment of the present application, the taking the groundwater level change at different time points obtained from the groundwater level data as the first entity includes the following steps:

acquiring the time series data of the groundwater level of each location coordinate to obtain the groundwater level data of each location coordinate at each time point in the time series;

comparing the groundwater level data at the current time point with the groundwater level data at the previous time point, determining the groundwater level change at the current time point according to the comparison result, so as to obtain the groundwater level change of each location coordinate at each time point in the time series; and taking the groundwater level change of each location coordinate at each time point in the time series as the first entity.

In an embodiment, since the time series is composed of time points, the change of the groundwater level at the current time point needs to be compared with the groundwater level at the previous time point to determine the change of the groundwater level at the current time point. Among them, the change of the groundwater level includes three situations: the groundwater level rises, the groundwater level drops, and the groundwater level remains unchanged.

As an optional embodiment of the present application, the taking the structural changes of buildings at different time points obtained from the building data as the second entity includes the following steps:

obtaining the structural information of different time series of each building to obtain the structural information of each building at each time point in the time series;

comparing the structural information at the current time point with the structural information at the previous time point, determining the structural changes of the building at the current time point, so as to obtain the structural changes of each building at each time point in the time series; and taking the structural changes of each building at each time point in the time series as the second entity.

In an embodiment, the structure of a building may include multiple types, such as foundations, walls, etc., and the changes that occur for each structure are also different. The structural changes of the building include but are not limited to foundation seepage, foundation structure damage, wall cracks, etc.

As an optional embodiment of the present application, the establishing the association between groundwater level data and building data through spatial relationship and temporal relationship includes the following steps:

according to the position coordinate of the building, the time series data of the groundwater level corresponding to the location coordinate within the preset area range of the position coordinate is obtained from the groundwater level data; and based on the same time point, the corresponding relationship between the structural information of the building at different time points and the time series data of the groundwater level corresponding to the building is established.

In an embodiment, based on the position coordinate of the building in the building data and the location coordinate in the groundwater level data, the building data and the groundwater data can be spatially linked. In this process, the relationship between them can be analyzed with the help of geographic information system (GIS) tools or databases, for example, whether a building is located in an area with high or low groundwater level. By establishing a time connection between the building data and the groundwater level data at the same time point, the spatial and temporal association data between the building and the groundwater level can be obtained. Through the association data, the groundwater level around each building at different time points, the groundwater level change, the various structures of the building and the structural change can be understood.

Step S130, based on the association between the groundwater level data and the building data, the influence relationship of the first entity on the second entity is extracted, and the influence degree of the first entity on the second entity is determined.

In an embodiment, the influence relationship of the first entity on the second entity can be extracted through query and analysis. In order to make the analysis more accurate, the influence of the rising groundwater level on the various structures of the building can be simulated by the hydrological model, and whether the groundwater level change has an impact on the structural change of the building can be analyzed, so as to obtain the influence relationship of the first entity on the second entity. And the influence degree of the first entity on the second entity is judged according to the analysis results. For example, the influence degree of the rising underground water level on the foundation permeability is medium.

As an optional embodiment of the present application, according to the association between groundwater level data and building data, the extracting the influence relationship of the first entity on the second entity and determining the influence degree of the first entity on the second entity includes the following steps:

according to the association between groundwater level data and building data, taking the building as the benchmark, inputting the time series data of the groundwater level within the preset area range of the building and the building data into the preset hydrological model;

simulating the influence of the building structure caused by the groundwater level change through the preset hydrological model, so as to obtain the influence relationship of the first entity on the second entity;

when the first entity has an influence relationship on the second entity, according to the association between the groundwater level data and the building data, obtaining the groundwater level data within the preset area range of the building as the influence degree judgment data; and comparing the influence degree judgment data with the preset influence degree threshold comparison table, to obtain the influence degree of the first entity on the second entity; the preset influence degree threshold comparison table includes the building structure name, the tolerable groundwater level height threshold range corresponding to the building structure name, and the influence degree corresponding to the tolerable groundwater level height threshold range.

In an embodiment, the first entity is the change of groundwater level, and the second entity is the structural change of the building. Whether the structural change of the building at the current time point is caused by the change of groundwater level, that is, whether the first entity has an influence relationship with the second entity, needs to be further analyzed and determined to avoid misjudgment. Generally, it can be obtained by means of hydrological model simulation. For example, the pressure effect of the rise of groundwater level on the foundation of the building is simulated by the hydrological model. Of course, it is not limited to this. It can also be obtained by establishing a database and analyzing the data. When it is determined that the first entity has an influence relationship with the second entity, it is determined whether the groundwater level data within the preset range of the building exceeds the threshold range of the tolerable groundwater level height. If it exceeds the maximum value of the tolerable groundwater level height threshold range, the influence degree can be set to severe. If it is less than the minimum value of the tolerable groundwater level height threshold range, the influence degree can be set to slight. If it is within the tolerable groundwater level height threshold range, the influence degree can be set to medium. Of course, the above-mentioned expression of the influence degree can also be replaced by other ways, and the present application does not make any special limitation on this. Among them, the preset influence threshold comparison table can be obtained based on the analysis of the collected historical data; the preset hydrological model can adopt the hydrological model of the existing technology. Since the hydrological model technology is an existing technology, it will not be described in detail.

Step S140, the first entity, the influence relationship, the second entity and the influence degree are used as the relationship quadruple between the groundwater level and the building, and a cross-domain knowledge graph is created based on the relationship quadruple.

In an embodiment, the first entity, the influence relationship, the second entity and the influence degree are taken as the relationship quadruple between the groundwater level and the building, and the first entity, the second entity, the influence relationship and the influence degree are integrated into the knowledge graph, so as to obtain a cross-domain knowledge graph. For example, the groundwater level monitoring point (location coordinate), the position coordinate of the building, and the entity information are added to the knowledge graph in the form of nodes, and the relationship between the groundwater level data and the building data is added to the graph in the form of edges. The establishment of the knowledge graph can be achieved by using technologies such as graph databases to support the query and analysis of complex relationships. Among them, the relationship quadruple can be: (groundwater level rise, leads to, foundation seepage, degree), (groundwater level rise, influence degree, foundation seepage, medium), (groundwater level rise, leads to, building structure damage, serious), (groundwater level rise, influence degree, building structure damage, slight) and other tabular forms. Of course, it is not limited to the above representation forms.

Step S150, updating the data information of the cross-domain knowledge graph in real time, and according to the data information updated in real time by the cross-domain knowledge graph, counting the risk situation of each building in the cross-domain knowledge graph according to the preset rules, and using the risk situation as the risk warning information for the building.

In an embodiment, updating the relationship quadruple, groundwater body data set, building data and other data information to the cross-domain knowledge graph in real time, and based on the updated data information, counting the risk situation for each building according to the preset rules, and using the risk situation as the risk warning information for the building. Among them, the form of the preset rules can be set as needed, and the calculation formula of the relationship between the risk level of the building and the groundwater level can be set in the preset rules, such as the risk assessment formula, so as to quickly understand the risk level of the building according to the data information updated in real time by the cross-domain knowledge graph, and give risk warning information according to different levels. Among them, the risk assessment formula is:

Risk=W1*groundwater level change rate+W2*vertical distance between groundwater level and building+W3*horizontal distance between groundwater level and building+W4*building structure influencing factors; among them, W1, W2, W3, and W4 are the weights of each factor, which can be adjusted and set according to the specific situation. The above factors are easy to obtain based on the updated data information.

Groundwater level change rate: the groundwater level change rate may be an important factor affecting buildings. A larger change rate may increase the risk of buildings. Quantitative data of groundwater level change rate can be used to weight risk assessment. Distance between groundwater level and building: Buildings closer to the groundwater level may be more susceptible to impact. The vertical distance between the groundwater level and the building, as well as the horizontal distance, can be considered. Building structure influencing factors, such as foundation conditions, may include: the depth, material, stability of the building foundation, and other factors will also affect the building's sensitivity to groundwater level changes. Preset rules can also be set in a rule definition manner. For example, a preset rule can be defined as: IF groundwater level rises AND building foundation damp THEN building risk level increases. IF groundwater level rises to a depth of less than 10 meters below the ground AND building foundation materials are susceptible to moisture THEN risk of moisture on the building foundation increases. IF groundwater level rises faster than 5 cm/month AND no waterproofing measures are taken for underground pipelines THEN risk of underground pipeline leakage increases. IF groundwater level continues to fluctuate by more than 20 cm/quarter AND building structure is aging THEN risk of deformation of the building structure increases. It mainly considers the impact of changes in the structures of each building and/or changes in the groundwater level within its preset range on its risk.

As an optional embodiment of the present application, updating the data information of the cross-domain knowledge graph in real time, counting the risk situation of each building in the cross-domain knowledge graph according to the preset rules based on the data information updated in real time in the cross-domain knowledge graph, and using the risk situation as the risk warning information for the building includes the following steps:

the change data of the first entity and the second entity in the cross-domain knowledge graph is obtained in real time, and the new influence relationship of the first entity on the second entity and the new influence degree of the first entity on the second entity are predicted according to the change data;

the change data, the new influence relationship and the new influence degree are updated to the cross-domain knowledge graph as real-time data information; and according to the real-time data information in the cross-domain knowledge graph, the risk situation of each building is counted according to the preset rules, and the risk situation of each building is used as the risk warning information for the building.

In an embodiment, the change data of the first entity and the second entity in the cross-domain knowledge graph, the influence relationship and the influence degree of the two entities are updated to the cross-domain knowledge graph. In order to make the data information of the knowledge graph more comprehensive, the changes of the groundwater level data and the building data can be synchronously updated to the cross-domain knowledge graph.

As an optional embodiment of the present application, after updating the data information of the cross-domain knowledge graph in real time, and according to the data information updated in real time of the cross-domain knowledge graph, counting the risk situation of each building in the cross-domain knowledge graph according to the preset rules, and using the risk situation as the risk warning information of the building, it also includes:

based on the position coordinate of the building, the cross-domain knowledge graph and the preset three-dimensional map of the building are correspondingly integrated to obtain a visualization graph; the preset three-dimensional map of the building includes the position coordinate of the building and the three-dimensional building at the position coordinate; and the data interaction interface is preset at the location of the three-dimensional building of the visualization graph; the data interaction interface includes real-time data display, warning prompts, alarm prompts and data query. In an embodiment, based on the position coordinate of the same building, the cross-domain knowledge graph is integrated with the preset three-dimensional map of the building, so as to obtain a visualization graph; and the visualization of the graph is linked with the three-dimensional map of the building, which can make the complex urban construction safety information more intuitive and easy to understand, and provide more effective decision support. The preset three-dimensional map of the building is used as a visualization carrier to display elements such as buildings, terrain, roads, etc. in the city, and the cross-domain knowledge graph provides a deeper understanding of the relationship between these elements.

The display of real-time data can be combined with groundwater level monitoring data and urban construction related information to display the changes in groundwater levels, the status of buildings, etc. in real time. This real-time display can help users understand the dynamic situation of the city in a timely manner and support real-time decision-making. The user interaction interface can provide users with data query functions by creating a data structure, so that users can interact with the knowledge graph through the map. For example, users can click on buildings or areas to obtain detailed information such as groundwater levels, construction plans, and safety risks related to them. Conversely, users can also query related map elements through the knowledge graph, and can also mark potential building risk areas on the map and related knowledge graph information. This can help urban planners more intuitively understand which buildings may face high groundwater level risks, so as to make targeted improvements and adjustments. Potential risk areas are marked on the map and combined with real-time monitoring data in the knowledge graph to achieve alarms and warnings. Users can intuitively identify possible risk points through the visual interface to help take timely measures. Among them, the data interaction interface can be implemented in the form of a data interface in the existing technology, which is an existing mature technology, so it will not be described in detail.

The knowledge graph-driven groundwater-oriented method and device for building risk warning provided by the present application has a wide range of application scenarios and good application prospects. The following are some possible application scenarios and prospects.

Application Scenarios:

urban planning and construction: urban planners can use the present application to evaluate the impact of groundwater level changes on buildings, so as to consider potential risks in the design and construction stages and formulate corresponding preventive measures;

infrastructure management: for existing infrastructure, such as bridges, tunnels, underground pipelines, etc., the present application can monitor groundwater level changes in real time, warn of possible building structural risks, and provide decision support for maintenance and reinforcement;

real estate development: real estate developers can conduct groundwater level risk assessment in the early stage of the project to avoid construction in high-risk areas, or take corresponding protective measures to reduce economic losses;

emergency management: when natural disasters occur, such as floods and earthquakes, the present application can quickly assess the risk level of affected buildings and provide important information for rescue operations; and environmental protection: environmental protection agencies can use the present application to monitor the impact of groundwater level changes on ecological devices, providing a scientific basis for ecological protection and restoration.

Application Scenario Outlook:

intelligent risk assessment: with the development of artificial intelligence and machine learning technology, the present application will be able to more accurately predict the trend of groundwater level changes and building risks, and realize intelligent risk assessment;

cross-domain integration: the application of knowledge graph technology will promote data integration and knowledge sharing between different fields, such as geographic information system (GIS), building information models (BIM), etc., to provide more comprehensive data support for risk warning;

real-time monitoring and warning: in the future, the present application is expected to realize a wider real-time monitoring network, collect groundwater level data in real time through the Internet of Things technology, and quickly respond and issue warning information; policy formulation and regulatory support: with the promotion of the present application in practical applications, it is expected to promote the formulation of relevant policies and regulations, and provide legal protection for groundwater resource management and building safety; and public education and awareness enhancement: through the popularization of the present application, the public's awareness of groundwater level changes and building risks can be improved, and the risk prevention awareness of all sectors of society can be enhanced.

In summary, the knowledge graph-driven groundwater-oriented method and device for building risk warning provided by the present application not only has practical application value at present, but also has a broader application prospect with the advancement of technology and the development of society.

As shown in FIG. 2, the present application provides a knowledge graph-driven groundwater-oriented device 200 for building risk warning, which can be installed in an electronic device. According to the functions implemented, the knowledge graph-driven groundwater-oriented device 200 for building risk warning can include: a data acquisition module 210, an entity relationship establishment module 220, a relationship extraction module 230, a knowledge graph creation module 240 and an warning module 250. The unit of the present application can also be called a module, which refers to a series of computer program segments that can be executed by an electronic device processor and can complete fixed functions, which are stored in the memory of the electronic device.

In this embodiment, the functions of each module/unit are as follows.

A data acquisition module 210 is used to collect groundwater level data and building data; the groundwater level data includes location coordinate and time series data of the groundwater level corresponding to the location coordinate; the building data includes the position coordinate of the building and the structural information of the building at different time points.

An entity relationship establishment module 220 is used to take the groundwater level changes at different time points obtained from the groundwater level data as the first entity, and the structural changes of the building at different time points obtained from the building data as the second entity, and establish the association between the groundwater level data and the building data through spatial relationship and temporal relationship.

A relationship extraction module 230 is used to extract the influence relationship of the first entity on the second entity and determine the influence degree of the first entity on the second entity according to the association between the groundwater level data and the building data.

A knowledge graph creation module 240 is used to take the first entity, influence relationship, second entity and influence degree as the relationship quadruple between the groundwater level and the building, and create a cross-domain knowledge graph based on the relationship quadruple.

A warning module 250 is used to update the data information of the cross-domain knowledge graph in real time, and according to the data information updated in real time by the cross-domain knowledge graph, count the risk situation of each building in the cross-domain knowledge graph according to the preset rules, and use the risk situation as the risk warning information for the building.

The knowledge graph-driven groundwater-oriented device 200 for building risk warning of the present application, by collecting groundwater level data and building data, extracts the relationship quadruple between groundwater level change and building structure change according to the collected data, creates a cross-domain knowledge graph based on the relationship quadruple, associates two different fields, effectively combines the two fields through the knowledge graph, and updates the cross-domain knowledge graph in real time to realize the building risk warning caused by groundwater level changes. The risk warning is based on the causal relationship reflected in the factual data, making the risk warning more accurate, and can effectively solve the problem of the lack of risk warning system for buildings due to groundwater level changes in the related art. The present application can use a cross-domain comprehensive knowledge graph to provide more comprehensive urban planning decision-making support and better cope with complex challenges in urban construction.

Figure 3:
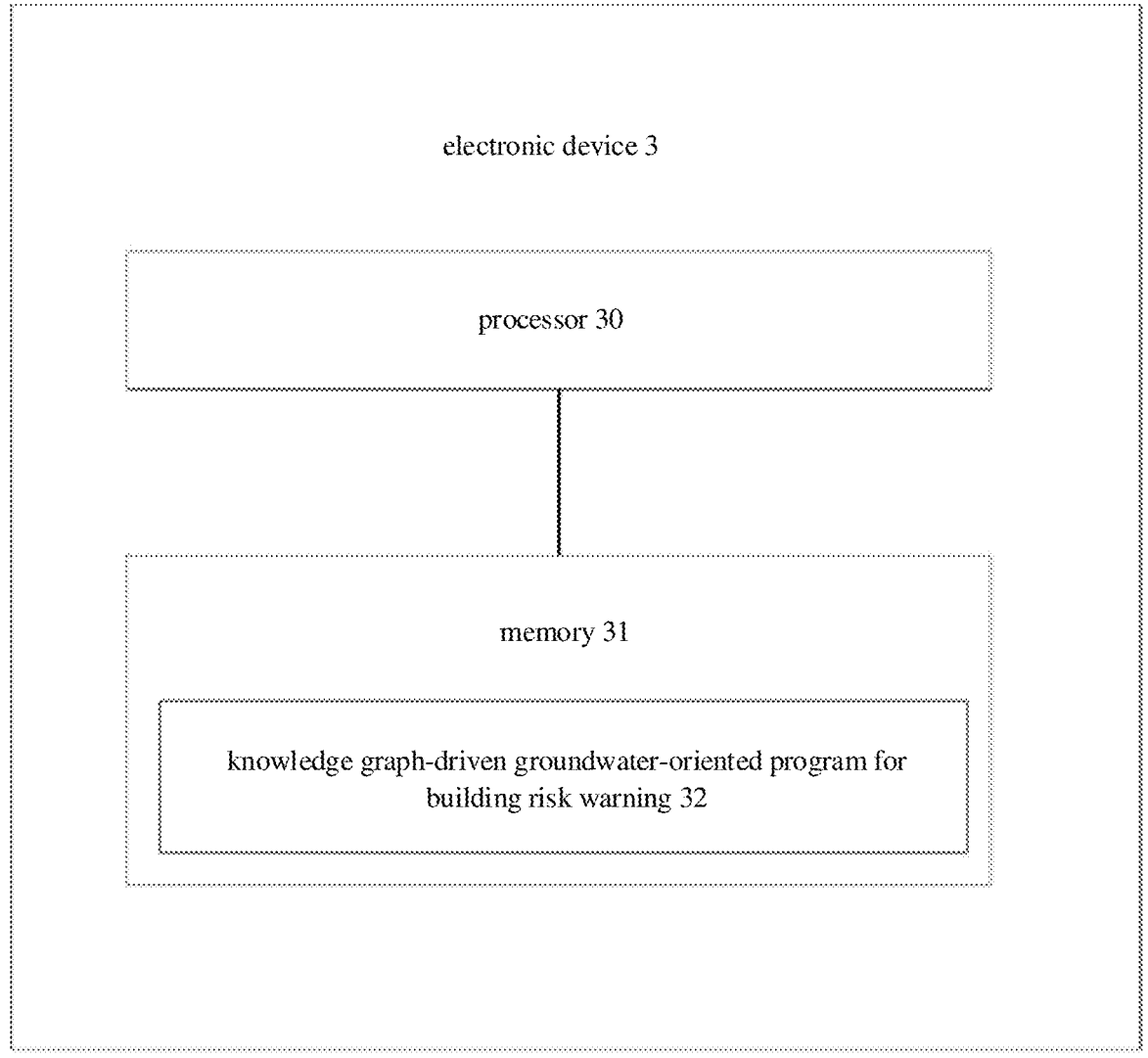
FIG. 3 is a schematic diagram of an internal structure of an electronic device for implementing the knowledge graph-driven groundwater-oriented method for building risk warning according to an embodiment of the present application.

As shown in FIG. 3, the present application provides an electronic device 3 of the knowledge graph-driven groundwater-oriented method for building risk warning.

The electronic device 3 may include a processor 30, a memory 31 and a bus, and may also include a computer program stored in the memory 31 and run on the processor 30, such as a knowledge graph-driven groundwater-oriented program 32 for building risk warning. The memory 31 may also include both the internal storage unit of the knowledge graph-driven groundwater-oriented device for building risk warning and the external storage device. The memory 31 may be used not only to store the code installed in the application software and various data, such as the code of the knowledge graph-driven groundwater-oriented program for building risk warning, but also to temporarily store the data that has been output or is to be output.

The memory 31 includes at least one type of readable storage medium, and the readable storage medium includes flash memory, mobile hard disk, multimedia card, card-type memory (such as SD or DX memory, etc.), magnetic memory, disk, optical disk, etc. The memory 31 may be an internal storage unit of the electronic device 3 in some embodiments, such as a mobile hard disk of the electronic device 3. The memory 31 may also be an external storage device of the electronic device 3 in other embodiments, such as a plug-in mobile hard disk, a smart media card (SMC), a secure digital (SD) card, a flash card, etc. equipped on the electronic device 3. Further, the memory 31 may also include both the internal storage unit of the electronic device 3 and the external storage device. The memory 31 can be used not only to store application software and various data installed in the electronic device 3, such as the knowledge graph-driven groundwater-oriented method for building risk warning code, but also to temporarily store data that has been output or is to be output.

In some embodiments, the processor 30 can be composed of an integrated circuit, such as a single packaged integrated circuit, or a plurality of integrated circuits with the same or different functions, including one or more central processing units (CPUs), microprocessors, digital processing chips, graphics processors, and various control chips. The processor 30 is the control unit of the electronic device, which uses various interfaces and lines to connect the various components of the entire electronic device, and executes various functions of the electronic device 3 and processes data by executing the program or module (such as the knowledge graph-driven groundwater-oriented program for building risk warning, etc.) stored in the memory 31 and calling the data stored in the memory 31.

The bus can be a peripheral component interconnect (PCI) bus or an extended industry standard architecture (EISA) bus. The bus can be divided into an address bus, a data bus, a control bus, etc. The bus is configured to realize connection and communication between the memory 31 and at least one processor 30, etc.

FIG. 3 only shows an electronic device with components. It can be understood by those skilled in the art that the structure shown in FIG. 3 does not constitute a limitation on the electronic device 3, and may include fewer or more components than shown, or combine certain components, or arrange components differently.

For example, although not shown, the electronic device 3 may also include a power supply (such as a battery) for powering each component. In an embodiment, the power supply may be logically connected to the at least one processor 30 through a power management system, so as to implement functions such as charging management, discharging management, and power consumption management through the power management system. The power supply may also include any components such as one or more direct current (DC) or alternating current (AC) power supplies, recharging systems, power failure detection circuits, power converters or inverters, and power status indicators. The electronic device 3 may also include a variety of sensors, Bluetooth modules, Wi-Fi modules, etc., which will not be described in detail here.

Further, the electronic device 3 may also include a network interface. In an embodiment, the network interface may include a wired interface and/or a wireless interface (such as a WI-FI interface, a Bluetooth interface, etc.), which is usually used to establish a communication connection between the electronic device 3 and other electronic devices.

In an embodiment, the electronic device 3 may also include a user interface, which may be a display, an input unit (such as a keyboard), or a standard wired interface or a wireless interface. In an embodiment, in some embodiments, the display may be a light emitting diode (LED) display, a liquid crystal display, a touch-sensitive liquid crystal display, and an organic light-emitting diode (OLED) touch device. The display may also be appropriately referred to as a display screen or a display unit, which is used to display information processed in the electronic device 3 and to display a visual user interface.

It should be understood that the embodiment is for illustrative purposes only and is not limited to this structure in the scope of the present application.

The knowledge graph-driven groundwater-oriented program 32 for building risk warning stored in the memory 31 of the electronic device 3 is a combination of multiple instructions. When running in the processor 30, it can achieve:

Step S110, collecting groundwater level data and building data; the groundwater level data includes location coordinate and time series data of groundwater level corresponding to the location coordinate; building data includes position coordinate of the building and structural information of the building at different time points;

Step S120, taking the groundwater level change at different time points obtained from the groundwater level data as the first entity, taking the structural change of the building at different time points obtained from the building data as the second entity, and establishing the association between groundwater level data and building data through spatial relationship and temporal relationship;

Step S130, extracting the influence relationship of the first entity on the second entity according to the association between the groundwater level data and the building data, and determining the influence degree of the first entity on the second entity;

Step S140, taking the first entity, influence relationship, second entity and influence degree as the relationship quadruple between groundwater level and building, and creating a cross-domain knowledge graph based on the relationship quadruple; and Step S150, updating the data information of the cross-domain knowledge graph in real time, and according to the data information updated in real time by the cross-domain knowledge graph, counting the risk situation of each building in the cross-domain knowledge graph according to the preset rules, and using the risk situation as the risk warning information for the building.

In an embodiment, the specific implementation method of the processor 30 for the above instructions can refer to the description of the relevant steps in the corresponding embodiment of FIG. 1, which will not be repeated here.

Further, if the module/unit integrated in the electronic device 3 is implemented in the form of a software functional unit and sold or used as an independent product, it can be stored in a computer-readable storage medium. The computer-readable medium may include: any entity or device that can carry the computer program code, recording medium, USB flash drive, mobile hard disk, disk, optical disk, computer memory, read-only memory (ROM).

The embodiment of the present application also provides a computer-readable storage medium, which can be non-volatile or volatile, and stores a computer program. When the computer program is executed by a processor, the following steps are achieved:

Step S110, collecting groundwater level data and building data; the groundwater level data includes location coordinate and time series data of the groundwater level corresponding to the location coordinate; the building data includes the position coordinate of the building and the structural information of the building at different time points;

Step S120, taking the groundwater level change at different time points obtained from the groundwater level data as the first entity, taking the structural change of the building at different time points obtained from the building data as the second entity, and establishing the association between groundwater level data and building data through spatial relation and temporal relationship;

Step S130, extracting the influence relationship of the first entity on the second entity according to the association between the groundwater level data and the building data, and determining the influence degree of the first entity on the second entity;

Step S140, taking the first entity, influence relationship, second entity and influence degree as the relationship quadruple between the groundwater level and the building, and creating a cross-domain knowledge graph based on the relationship quadruple; and Step S150, updating the data information of the cross-domain knowledge graph in real time, and according to the data information updated in real time by the cross-domain knowledge graph, counting the risk situation of each building in the cross-domain knowledge graph according to the preset rules, and using the risk situation as the risk warning information for the building.

In an embodiment, the specific implementation method when the computer program is executed by the processor can refer to the description of the relevant steps in the knowledge graph-driven groundwater-oriented method for building risk warning in the embodiment, which will not be repeated here.

In several embodiments provided by the present application, it should be understood that the disclosed equipment, devices and methods can be implemented in other ways. For example, the device embodiments described above are only schematic. For example, the division of the modules is only a logical function division, and there may be other division methods in actual implementation.

The modules described as separate components may or may not be physically separated, and the components displayed as modules may or may not be physical units, that is, they may be located in one place or distributed on multiple network units. Some or all of the modules may be selected according to actual needs to achieve the purpose of the scheme of this embodiment.

In addition, the functional modules in various embodiments of the present application may be integrated into a processing unit, or each unit may exist physically separately, or two or more units may be integrated into one unit. The above-mentioned integrated units may be implemented in the form of hardware or in the form of hardware plus software functional modules.

For those skilled in the art, it is obvious that the present application is not limited to the details of the above-mentioned exemplary embodiments, and the present application can be implemented in other specific forms without departing from the spirit or basic features of the present application.

Finally, it should be noted that the above embodiments are only used to illustrate the technical solution of the present application rather than to limit it. Although the present application has been described in detail with reference to some embodiments, those skilled in the art should understand that the technical solution of the present application can be modified or replaced by equivalents without departing from the spirit and scope of the technical solution of the present application.

What is claimed is:

1. A building risk warning system, comprising:

an electronic device including a processor and a memory storing instructions, wherein the instructions, when executed by the processor, cause the electronic device to:

acquire groundwater level measurement data from a plurality of geographically distributed monitoring sensors through a real-time monitoring network and building data of a plurality of buildings, wherein the groundwater level measurement data comprises location coordinates and time-series groundwater level measurements corresponding to the location coordinates, and the building data comprises position coordinates of the buildings and structural information of the buildings at different time points;

process the time-series groundwater level measurements to determine groundwater level variations at the plurality of monitoring sensors over time;

process the structural information of the buildings to determine structural state changes of the buildings at the different time points;

determine, based on spatial relationships between the monitoring sensors and the buildings and temporal relationships of the time-series measurements, a physical interaction relationship representing an effect of the groundwater level variations on structural states of the buildings;

determine an influence degree corresponding to the physical interaction relationship;

construct a relationship quadruple including:
    the groundwater level variations,
    the structural state changes,
    the physical interaction relationship, and
    the influence degree;

construct a real-time cross-domain knowledge graph based on the relationship quadruple, wherein the cross-domain knowledge graph represents physical interaction relationships between groundwater conditions and the structural states of the buildings;

update the real-time cross-domain knowledge graph continuously based on newly acquired groundwater level measurement data and building data;

determine a structural stability condition of at least one building based on the real-time cross-domain knowledge graph and predefined structural safety criteria;

generate risk warning information corresponding to the structural stability condition; and trigger, via a warning module of the electronic device, a risk warning operation for the at least one building, wherein the risk warning operation comprises:
    activating an alarm mechanism;

generating an alarm prompt; and outputting the alarm prompt via a user interface of the electronic device to provide real-time structural monitoring of the at least one building.

2. The building risk warning system of claim 1, wherein, to determine the groundwater level variations, the instructions cause the electronic device to:

acquire the time-series groundwater level measurements for each of the location coordinates to obtain groundwater level measurement of each location coordinate at each time point in a time series;

compare groundwater level measurement at a current time point with groundwater level measurement at a previous time point; and determine, according to a comparison result, a groundwater level variation at the current time point for each location coordinate.

3. The building risk warning system of claim 1, wherein, to determine the structural state changes of the buildings, the instructions cause the electronic device to:

acquire the structural information of each building at each time point in a time series;

compare structural information at a current time point with structural information at a previous time point; and determine, according to a comparison result, a structural state change of the building at the current time point.

4. The building risk warning system of claim 1, wherein, to determine the physical interaction relationship, the instructions cause the electronic device to:

according to a position coordinate of a building, obtain, from the groundwater level measurement data, time-series groundwater level measurements corresponding to location coordinates within a preset area range of the position coordinate; and based on a same time point, determine a corresponding physical interaction relationship between the structural information of the building at different time points and the time-series groundwater level measurements corresponding to the building.

5. The building risk warning system of claim 4, wherein, to determine the physical interaction relationship and the influence degree, the instructions cause the electronic device to:

based on the physical interaction relationship between the groundwater level measurement data and the building data, take the building as a benchmark and input the time-series groundwater level measurements within the preset area range of the building and the building data into a preset hydrological model;

simulate, by the preset hydrological model, an influence of the groundwater level variations on a structure of the building, so as to obtain the physical interaction relationship;

in response to determining that the groundwater level variations have the physical interaction relationship with the structural state changes of the building, obtain groundwater level measurements within the preset area range of the building as influence degree judgment measurements; and compare the influence degree judgment measurements with a preset influence degree threshold comparison table to obtain the influence degree, wherein the preset influence degree threshold comparison table comprises a building structure name, a tolerable groundwater level height threshold range corresponding to the building structure name, and an influence degree corresponding to the tolerable groundwater level height threshold range.

6. The building risk warning system of claim 1, wherein, to update the real-time cross-domain knowledge graph continuously and determine the structural stability condition, the instructions cause the electronic device to:

acquire, in real time, variation measurements of the groundwater level variations and the structural state changes in the cross-domain knowledge graph;

predict, based on the variation measurements, a new physical interaction relationship and a new influence degree;

update the variation measurements, the new physical interaction relationship, and the new influence degree to the cross-domain knowledge graph as real-time measurement information; and determine the structural stability condition of each building according to the real-time measurement information in the cross-domain knowledge graph and the predefined structural safety criteria.

7. The building risk warning system of claim 1, wherein the risk warning operation further comprises:

based on the position coordinates of the buildings, integrating the cross-domain knowledge graph correspondingly with a preset three-dimensional map of the buildings to obtain a visualization map, wherein the preset three-dimensional map comprises the position coordinates of the buildings and three-dimensional buildings at the position coordinates; and presetting an interaction interface at a location of the three-dimensional buildings in the visualization map, wherein the interaction interface comprises real-time measurement display information, warning prompts, alarm prompts, and query.

8. A method for building risk warning, comprising:

acquiring, by an electronic device including a processor, groundwater level measurement data from a plurality of geographically distributed monitoring sensors through a real-time monitoring network and building data of a plurality of buildings, wherein the groundwater level measurement data comprises location coordinates and time-series groundwater level measurements corresponding to the location coordinates, and the building data comprises position coordinates of the buildings and structural information of the buildings at different time points;

processing, by the electronic device, the time-series groundwater level measurements to determine groundwater level variations at the plurality of monitoring sensors over time;

processing, by the electronic device, the structural information of the buildings to determine structural state changes of the buildings at the different time points;

determining, by the electronic device, based on spatial relationships between the monitoring sensors and the buildings and temporal relationships of the time-series measurements, a physical interaction relationship representing an effect of the groundwater level variations on structural states of the buildings;

determining, by the electronic device, an influence degree corresponding to the physical interaction relationship;

constructing, by the electronic device, a relationship quadruple including:

the groundwater level variations, the structural state changes, the physical interaction relationship, and the influence degree;

constructing, by the electronic device, a real-time cross-domain knowledge graph based on the relationship quadruple, wherein the cross-domain knowledge graph represents physical interaction relationships between groundwater conditions and building structural states;

updating, by the electronic device, the real-time cross-domain knowledge graph continuously based on newly acquired groundwater level measurement data and building data;

determining, by the electronic device, a structural stability condition of at least one building based on the real-time cross-domain knowledge graph and predefined structural safety criteria;

generating, by the electronic device, risk warning information corresponding to the structural stability condition; and triggering, via a warning module of the electronic device, a risk warning operation for the at least one building, wherein the risk warning operation comprises:

activating an alarm mechanism;

generating an alarm prompt; and outputting the alarm prompt via a user interface of the electronic device to provide real-time structural monitoring of the at least one building.

9. A non-transitory computer-readable storage medium storing a plurality of instructions, wherein the instructions, when executed by a processor of an electronic device, cause the electronic device to perform operations comprising:

acquiring groundwater level measurement data from a plurality of geographically distributed monitoring sensors through a real-time monitoring network and building data of a plurality of buildings, wherein the groundwater level measurement data comprises location coordinates and time-series groundwater level measurements corresponding to the location coordinates, and the building data comprises position coordinates of the buildings and structural information of the buildings at different time points;

processing the time-series groundwater level measurements to determine groundwater level variations at the plurality of monitoring sensors over time;

processing the structural information of the buildings to determine structural state changes of the buildings at the different time points;

determining, based on spatial relationships between the monitoring sensors and the buildings and temporal relationships of the time-series measurements, a physical interaction relationship representing an effect of the groundwater level variations on structural states of the buildings;

determining an influence degree corresponding to the physical interaction relationship;

constructing a relationship quadruple including:

the groundwater level variations, the structural state changes, the physical interaction relationship, and the influence degree;

constructing a real-time cross-domain knowledge graph based on the relationship quadruple, wherein the cross-domain knowledge graph represents physical interaction relationships between groundwater conditions and building structural states;

updating the real-time cross-domain knowledge graph continuously based on newly acquired groundwater level measurement data and building data;

determining a structural stability condition of at least one building based on the real-time cross-domain knowledge graph and predefined structural safety criteria;

generating risk warning information corresponding to the structural stability condition; and triggering, via a warning module of the electronic device, a risk warning operation for the at least one building, wherein the risk warning operation comprises:

activating an alarm mechanism;

generating an alarm prompt; and outputting the alarm prompt via a user interface of the electronic device to provide real-time structural monitoring of the at least one building.

* * * * *